(12) United States Patent
Armendariz Lekumberry et al.

(10) Patent No.: US 11,340,309 B2
(45) Date of Patent: May 24, 2022

(54) METHOD FOR PERFORMING A TESTING PROCEDURE OF AN ELECTRICAL POWER SYSTEM FOR A WIND TURBINE AND AN ELECTRICAL POWER SYSTEM

(71) Applicant: Siemens Gamesa Renewable Energy Innovation & Technology S.L., Sarriguren (ES)

(72) Inventors: Jonay Armendariz Lekumberry, Pamplona (ES); Miguel Ángel Sepúlveda Gonzalez, Madrid (ES)

(73) Assignee: SIEMENS GAMESA RENEWABLE ENERGY INNOVATION & TECHNOLOGY S.L

( * ) Notice: Subject to any disclaimer, the term of this patent is extended or adjusted under 35 U.S.C. 154(b) by 215 days.

(21) Appl. No.: 16/728,106

(22) Filed: Dec. 27, 2019

(65) Prior Publication Data

US 2020/0326383 A1 Oct. 15, 2020

(30) Foreign Application Priority Data

Nov. 7, 2018 (EP) .................................... 18380011

(51) Int. Cl.
*G01R 31/40* (2020.01)
*H02P 9/02* (2006.01)

(52) U.S. Cl.
CPC ................ *G01R 31/40* (2013.01); *H02P 9/02* (2013.01)

(58) Field of Classification Search
CPC ... G01R 31/40; H02P 9/02; H02P 9/08; Y02E 10/76; H02J 2300/28; H02J 3/381; H02J 3/42; F03D 17/00; H02M 1/36
(Continued)

(56) References Cited

U.S. PATENT DOCUMENTS 7,131,686 B1 11/2006 Jo et al.
8,933,652 B2 * 1/2015 Hagedorn ............. F03D 7/0224
318/139
(Continued)

FOREIGN PATENT DOCUMENTS

KR 20050046890 A 5/2005

OTHER PUBLICATIONS

Galindo Del Valle, Roberto et al; "On the emulation of an isolated wind energy conversion system: Experimental results"; Electronics, Robotics and automotive mechanics conference; Cerma '09; IEEE, Piscataway; pp. 462-467; XP031571763; ISBN: 978-0-7695-3799-3; 2009.
(Continued)

*Primary Examiner* — Giovanni Astacio-Oquendo
(74) *Attorney, Agent, or Firm* — Schmeiser, Olsen & Watts LLP

(57) ABSTRACT

Provided is a method for performing a testing procedure of an electrical power system for a wind turbine by means of a power supply unit, wherein the method includes connecting the power supply unit to a low voltage distribution system of the wind turbine. The method further includes closing a low voltage circuit breaker so that electrical connection is provided between the low voltage distribution system and an auxiliary transformer. Electrical power to a power converter is provided from the power supply unit via the low voltage distribution system thereby energizing a direct current link of the power converter. The power converter is synchronized with an electrical grid, and a main transformer switchgear unit is closed, such that electrical connection is provided between a main transformer and the electrical grid.

14 Claims, 3 Drawing Sheets

(58) Field of Classification Search
USPC .................................. 324/764.01, 537, 500
See application file for complete search history.

(56) References Cited

U.S. PATENT DOCUMENTS

| | | | |
|---|---|---|---|
| 11,199,177 B2* | 12/2021 | Andersen | F03D 17/00 |
| 2008/0084070 A1 | 4/2008 | Teichmann et al. | |
| 2009/0107256 A1* | 4/2009 | Jensen | G01M 5/005 |
| | | | 73/862 |
| 2009/0284999 A1 | 11/2009 | Gibbs et al. | |
| 2012/0146423 A1 | 6/2012 | Bodewes et al. | |
| 2012/0219421 A1* | 8/2012 | Bjork | F03D 7/0224 |
| | | | 416/153 |
| 2013/0127482 A1* | 5/2013 | Chang | G01R 31/40 |
| | | | 324/750.05 |
| 2016/0139001 A1* | 5/2016 | Tran | F01D 21/003 |
| | | | 73/116.03 |
| 2017/0199439 A1* | 7/2017 | Jia | G09G 3/006 |
| 2017/0284369 A1 | 10/2017 | Chen et al. | |
| 2018/0069404 A1 | 3/2018 | Schult et al. | |
| 2018/0172775 A1* | 6/2018 | Thomsen | F03D 80/82 |
| 2018/0254628 A1 | 9/2018 | Schelenz et al. | |

OTHER PUBLICATIONS

Extended European Search Report for Application No. 18380011.9, dated May 20, 2019.

\* cited by examiner

METHOD FOR PERFORMING A TESTING PROCEDURE OF AN ELECTRICAL POWER SYSTEM FOR A WIND TURBINE AND AN ELECTRICAL POWER SYSTEM

CROSS-REFERENCE TO RELATED APPLICATIONS

This application claims priority to EP Application No. 18380011.9, having a filing date of Nov. 7, 2018, the entire contents of which are hereby incorporated by reference.

FIELD OF TECHNOLOGY

The following relates to a method and an arrangement for performing a testing procedure of an electrical power system for a wind turbine.

BACKGROUND

A wind turbine may comprise electrical power system that includes a generator, a main transformer, a main transformer switchgear unit, an auxiliary transformer, an auxiliary transformer switchgear unit, a low voltage distribution system, a power converter and an electrical grid. The electrical grid may also be referred to as wind turbine internal high voltage grid or switchgear bus, different from an external electrical network frequently called grid or public grid.

The electrical grid may consist of electrical cables connecting the components of the electrical power system. The power converter may include a direct current link.

Before a wind turbine is connected to an external electrical network for providing electrical power to consumers, the electrical power system of the wind turbine needs to be commissioned.

Components of the electrical power system of the wind turbine need to operate according to the requirements and standards. A high voltage source is needed to test high voltage components of the electrical power system of the wind turbine that may comprise the main transformer, the auxiliary transformer, and/or high voltage cables. High voltage needed for testing of the electrical power system of a wind turbine may, for example, be provided by means of external hardware components at a test area. Alternatively, wind turbine components may be transported to a location where a high voltage connection point is available for performing the test, before transporting the wind turbine components to the final site of erection of the wind turbine.

One way of performing testing procedure of the electrical power system for the wind turbine includes either providing expensive hardware components capable of generating high voltage to the test area or transporting pre-assembled wind turbine components to a location where such high voltage connection point exists. Some of the drawbacks of these methods are price of hardware components capable of generating high voltage, transportation costs, time duration needed for contracting and developing high voltage connection point.

Patent application US2018/254628A1 discloses a power system with an electric circuit connected between a power grid and a power source. The electric circuit includes a main power converter having main input terminals connected to the power source by a DC link and output terminals. The main power converter is controlled by a controller. The electric circuit includes a main transformer having a primary winding and a secondary winding, the primary winding being connected to the output terminals of the main power converter. Main switchgear is connected between the secondary winding of the main transformer and the power grid. An auxiliary transformer has a primary winding connected to the power grid in parallel with the main switchgear and a secondary winding connected to the controller. A pre-charge circuit is connected between the auxiliary transformer and the DC link.

Patent application KR20050046890A relates to a power supply system, and more particularly, to a distributed power supply system of a self-generating load side power system connected to a commercial load side power system. Generally, the power supply system is designed to supply the power generated by the power plant to the load on the customer side through a transmission line. FIG. 1 shows a power source connected to the DC link of the power converter thereby energizing the converter.

Patent application US2009/284999A1 shows a medium voltage adjustable frequency drive includes an input isolation transformer having a three-phase input and a three-phase output, a converter having a three-phase input electrically connected to the three-phase output of the input isolation transformer and an output providing a direct current bus, an inverter having an input electrically connected to the output of the converter and a three-phase output, and a pre-charge circuit. The pre-charge circuit includes a ferroresonant transformer circuit having a primary winding structured to input a low voltage and a secondary winding structured to output a medium voltage and provide a constant current source.

Patent application US2018/069404A1 discloses a method for connecting a main converter, e.g. for use in a power plant for regenerative energy having a generator, to a power grid. The method includes providing energy from the pre-charge unit to at least one of at least two converter paths. The at least one converter path is pre charged using the energy provided from the pre-charge unit. At least one further converter path of the at least two converter paths is precharged using the energy provided from the pre-charge unit via the at least one converter path through the grid side converter of the at least one converter path and the grid side converter of the at least one further converter path. The main converter is connected to the power grid by closing the grid breaker.

Article "On the Emulation of an Isolated Wind Energy Conversion System: Experimental Results" presents the emulation of an isolated wind energy conversion system, which is composed by a doubly-fed induction generator, a back-to-back converter connected to its rotor, a LC filter to minimize the harmonic pollution in the generated voltage and an isolated three-phase load. The test bench is described, and its operational capabilities are introduced. Afterwards, the control system design is presented. An experimental study which considers the possibility of using the self-excitation of the doubly fed induction generator to achieve the black-start of the isolated wind energy conversion system is discussed.

Patent application US2017/284369A1 discusses a method and a control system using the same for coordinating control of a plurality of wind turbines of a wind farm during a fault in a utility grid to which power is to be delivered via at least one cable of the wind farm. The method includes: opening each of the electrical connections; selecting at least one wind turbine of the plurality of wind turbines according to a criteria where a sum of value for active power supply that is available from the selected at least one generator is equal or above a sum of values for active power consumption that is consumable by the energy storage system of the selected at least one wind turbine, the auxiliary equipment of the selected at least one wind turbine and the substation level auxiliary equipment; activating the selected wind turbine; for the selected wind turbine: electrically connecting the power input of its converter to the power output of its generator, electrically connecting the power output of its converter to the power input of its auxiliary equipment, the power input of its energy storage system and the corresponding cable, and electrically connecting the power input of a substation level auxiliary equipment to the cable which is electrically connected to the selected wind turbine; the activated wind turbine acting as active power supply for the substation level auxiliary equipment. The method and the control system using the same provide an effective and economic way of using the power generated by the wind turbine generator for powering the auxiliary equipment of the wind turbine, charging the energy storage system of the wind turbine and powering the substation level auxiliary equipment, during the period wind farm operates in an islanding mode.

Patent application US2008/084070A1 describes a method and a system for island operation of at least two wind turbines associated with a wind farm, wherein said wind farm is configured for providing power generated by wind turbines in said wind farm to a main grid and wherein the method comprises: detecting at least two or more deactivated wind turbines in said wind farm, said deactivated wind turbines being disconnected from said main grid; configuring at least one islanded local grid for electrically connecting said two or more deactivated wind turbines; activating at least one of said deactivated wind turbine using a black start operation; and, connecting said at least one activated wind turbine and at least one of said deactivated wind turbines to said local grid, said activated wind turbine acting as a power supply for said at least one deactivated wind turbine connected to said local grid.

Patent application US2008/0084070A1 describes a wind turbine having features for black-starting including an electric generation system for producing electricity by operation of the wind and comprising an interface for providing the electricity to an electric grid; a control system for controlling components of the wind turbine during start-up of the electric generation system, wherein start-up occurs during a deficient electric signal of the grid; and at least one energy providing element and at least one energy dissipative element for providing a balance between an output of the wind turbine and the electric signal of the grid.

SUMMARY

An aspect relates to offer alternative methods for performing testing procedure of an electrical power system for a wind turbine.

In accordance with embodiments of the invention a method for performing a testing procedure of the electrical power system is provided for the wind turbine. A power supply unit is electrically connected to a low voltage distribution system of the wind turbine. A low voltage circuit breaker is closed thereby providing electrical connection between the low voltage distribution system and an auxiliary transformer of the wind turbine. Electrical power is provided to a power converter from the power supply unit via the low voltage distribution system thereby energizing a direct current link of the power converter. The power converter is synchronised with an electrical grid. A main transformer switchgear unit is closed such that electrical connection is provided between a main transformer and the electrical grid.

Advantage that described method offers, is that commissioning of electrical power system can be performed by generating high voltage without the necessity of using additional high voltage generating hardware, and/or without the necessity to transport components of the electrical power system to a testing facility that offers a high voltage connection point. Instead, performing the testing procedure can be executed in the original assembly workshop.

The term "main transformer" defines the transformer that can be in a main power path between the generator and an external electrical grid.

The term "auxiliary transformer" defines the transformer that can be located between the low voltage distribution system and the main transformer. It can be used to adapt the main transformer output voltage to a voltage level of auxiliary power system during regular operation of the wind turbine. According to embodiments of the invention, auxiliary transformer can be used as a step-up transformer.

According to an exemplary embodiment of the invention the power supply unit that is connected to the low voltage distribution system may be a 3-phase alternating current power supply unit, a low voltage 3-phase alternating current power supply unit. This type of the power supply unit may be available at any testing facility for electrical power system for a wind turbine.

In a further embodiment, before the power supply unit is connected to the low voltage distribution system of the wind turbine, the power converter may be switched off. Alternatively, a direct current link of the power converter may not be energised.

In an embodiment the power converter may be comprised of a single power converter module. Alternatively, the power converter may comprise two or more power converter modules operating in parallel.

In an exemplary embodiment energising the direct current link of the power converter may be performed by providing direct current to the direct current link of the power converter via a direct current pre-charging unit.

As one option, the direct current pre-charging unit may be adapted to convert alternating current from the low voltage distribution system to direct current for providing energy to the direct current link of the power converter.

Synchronization of the power converter and the electrical grid can be achieved by a converter control unit controlling a grid side converter so that the phase and frequency of the grid side converter output voltage match the phase and frequency of the electrical grid voltage.

In an embodiment the main transformer may be a three-winding transformer with two windings connected to outputs of two power converter modules. Alternatively, one of the main transformer windings may be connected to output of one power converter module.

The electrical grid may be an internal high voltage grid of the wind turbine.

Embodiments of the invention are further directed to an electrical power system for which the previously explained method is performed. The electrical power system comprises a low voltage distribution system, a power supply unit, a main transformer, a main transformer switchgear unit, an auxiliary transformer, an auxiliary transformer switchgear unit, a power converter and an electrical grid.

The electrical power system may further comprise a distribution panel, a cooling system, a fire protection system, a direct current pre-charging unit, a control device, and electrical cables.

The direct current pre-charging unit may be electrically connected with the low voltage distribution system of the wind turbine.

Advantageously, the direct current pre-charging unit may be adapted to convert alternating current from the low voltage distribution system to direct current for providing energy to the direct current link of the power converter.

In one embodiment the power supply unit may be adapted to supply the auxiliary transformer with electrical power, wherein the low voltage circuit breaker and the auxiliary transformer may be provided in series between the low voltage distribution system and an electrical grid.

In one embodiment the main transformer switchgear unit and the main transformer may be provided in series between the electrical grid and the power converter.

As an exemplary embodiment the power supply unit may be integrated in a test bed or a workshop.

In this way all components of the electrical power system will be provided (energised or loaded) with their rated voltage. Once the components are loaded with their rated voltage, it is possible to perform inspection of the various electrical components of the electrical power system. Inspection may comprise visual inspection of various switchgear units, cables and terminals. Alternatively, inspection may comprise performing electrical test procedures, for example voltage and/or current measurements in the components of the electrical power system, for example transformers or the electrical power converter.

In one embodiment, electrical power system for a wind turbine may be connected to a power supply unit and a power supply unit is a part of a test bed environment. Electrical power system for a wind turbine comprises a low voltage circuit breaker, a main transformer, a main transformer switchgear unit, an auxiliary transformer, an auxiliary transformer switchgear unit, a power converter and an electrical grid. All listed components of the electrical power system are comprised within the wind turbine wherein the power supply unit is comprised in the test bed environment which is not a part of the wind turbine.

Embodiments of the invention are also applicable for any type of electrical power systems used, e.g. in power generating facilities or other industrial facilities.

The aspects defined above and further aspects of embodiments of the present invention are apparent from the examples of embodiment to be described hereinafter and are explained with reference to the examples of embodiment.

BRIEF DESCRIPTION

Some of the embodiments will be described in detail, with reference to the following figures, wherein like designations denote like members, wherein.

The illustration in the drawing is schematically shown. It is noted that for similar or identical elements in different figures, the same reference signs will be used.

Some of the features and especially the advantages will be explained for an electrical power system for a wind turbine, but obviously the features can be applied also to the electrical power systems of other power generating plants or industrial facilities.

DETAILED DESCRIPTION

Figure 1:
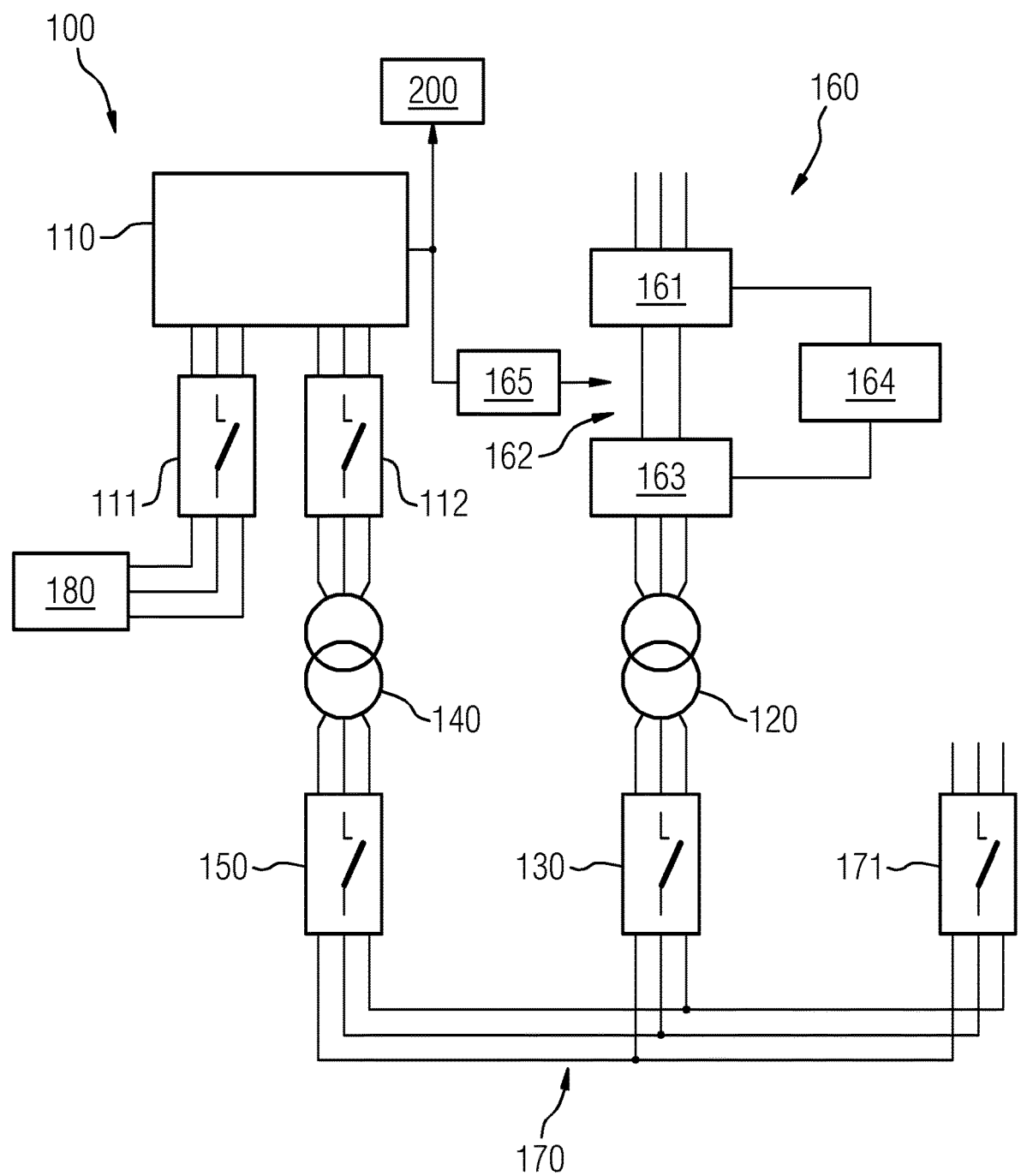
FIG. 1 shows schematically an embodiment of an electrical power system for a wind turbine according to the invention in a principle manner.

Referring now to FIG. 1, an electrical power system 100 for a wind turbine is illustrated.

The electrical power system 100 includes a low voltage distribution system 110, a main transformer 120, a main transformer switchgear unit 130, an auxiliary transformer 140, an auxiliary transformer switchgear unit 150, a power converter 160 and an electrical grid 170. Voltage level of the low voltage distribution system 110 may be for example 400 volts. The low voltage distribution system 110 may be used to deliver electrical energy to components of an auxiliary system 200 of a wind turbine. These components may include control devices, sensors, cooling system, fans, pumps, heaters, air treatment units and/or lights.

A first low voltage circuit breaker 111, when closed, provides electrical connection between the low voltage distribution system 110 and a power supply unit 180. Electrical connection between the low voltage distribution system 110 and the power supply unit 180 is disrupted when the first low voltage circuit breaker 111 is open.

In an exemplary embodiment, the power supply unit 180 is a 3-phase alternating current low voltage power supply unit. The low voltage power supply unit may be, for example, a 400 volts 3 phase power supply unit. In general, the low voltage power supply unit and the voltage level of the low voltage distribution system 110, in accordance with embodiments of the invention may be in a range of 100 volts to 2000 volts in the range 200 volts to 600 volts.

The power supply unit 180 may be comprised within the electrical power system 100 for a wind turbine. Alternatively, the power supply unit 180 may be integrated in a test bed or in a workshop at a location where the electrical power system 100 could be tested. The test bed may provide an interface from the low voltage distribution system 110 to the power supply unit 180.

A second low voltage circuit breaker 112 allows electrical connection between the low voltage distribution system 110 and an auxiliary transformer 140.

The auxiliary transformer 140, in an exemplary embodiment, is used to raise the voltage from the voltage level of the low voltage distribution system 110 to the high voltage level of the electrical grid 170. As an example, the auxiliary transformer 140 may be used to raise voltage from the voltage level of 400 volts to the voltage level of 20 kilovolts.

The auxiliary transformer 140 can be electrically connected to the main transformer 120 via an electrical grid 170. The auxiliary transformer 140 is equipped with an auxiliary transformer switchgear unit 150 and the main transformer 120 is equipped with the main transformer switchgear unit 130.

The main transformer switchgear unit 130 and the auxiliary transformer switchgear unit 150 are used to either electrically connect or disconnect respective transformers from the electrical grid 170.

Figure 2:
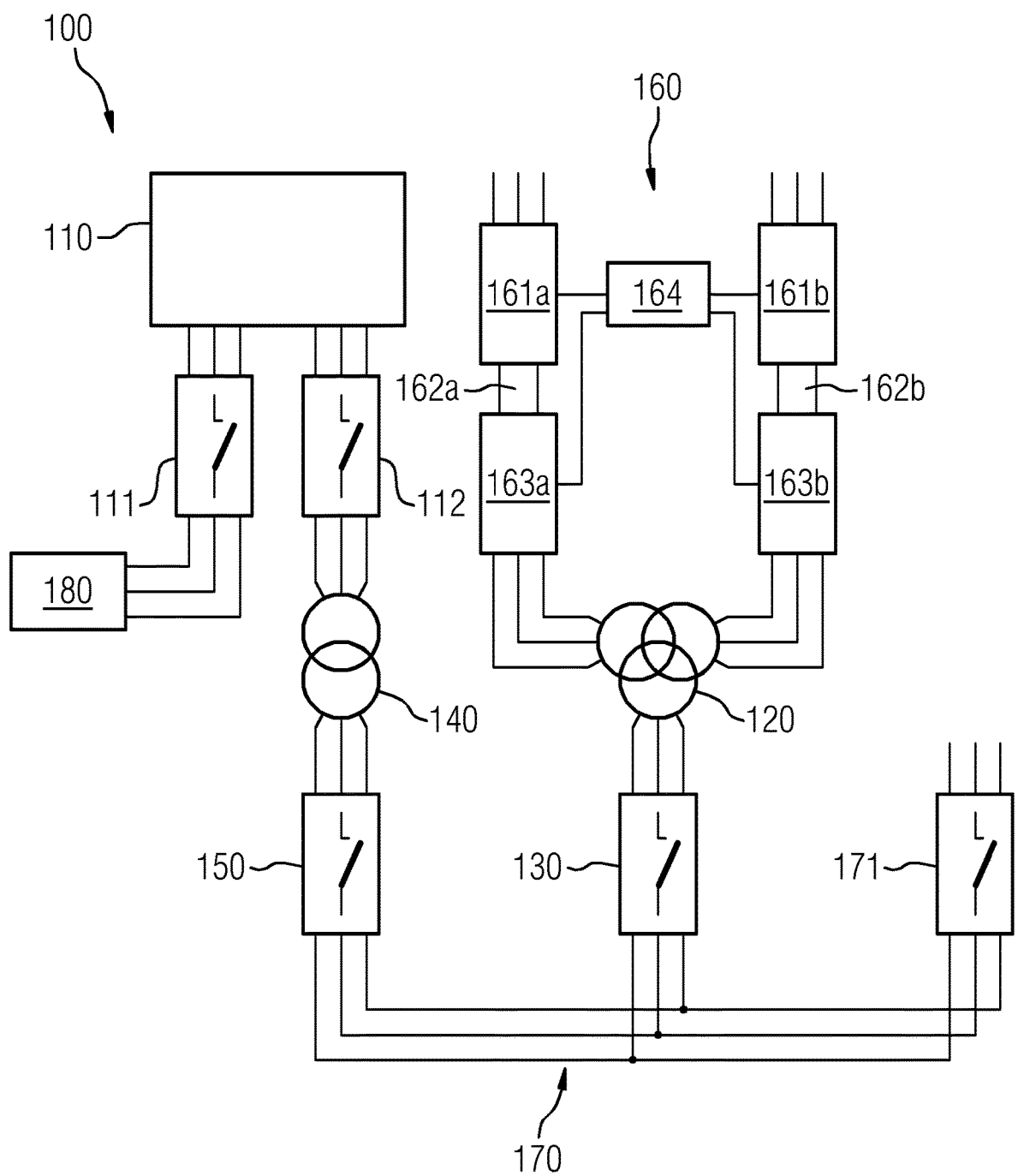
FIG. 2 shows a second embodiment of an electrical power system for a wind turbine according to the invention in a principle manner.

The power converter 160 is connected to the electrical grid 170 via the main transformer 120. The power converter 160 may be comprised of a generator side converter 161, a direct current link 162 of the power converter 160 and a grid side converter 163. Switching operation of the power converter 160 is controlled via a converter control unit 164. The power converter 160 may be comprised of multiple power converter units operating in parallel, for example two units as shown in FIG. 2. The power converter 160, as shown in FIG. 2, may comprise two generator side converters 161a and 161b, two direct current links 162a and 162b of the power converter 160 and two grid side converters 163a and 163b.

The direct current link 162 of the power converter 160 may be electrically connected to the low voltage distribution system 110 via a direct current pre-charging unit 165.

The main transformer 120 may be a three-winding transformer where two windings are connected to outputs of different converter units, as shown in FIG. 2.

Method for performing a testing procedure of the previously defined electrical power system 100 for a wind turbine is described next.

Figure 3:
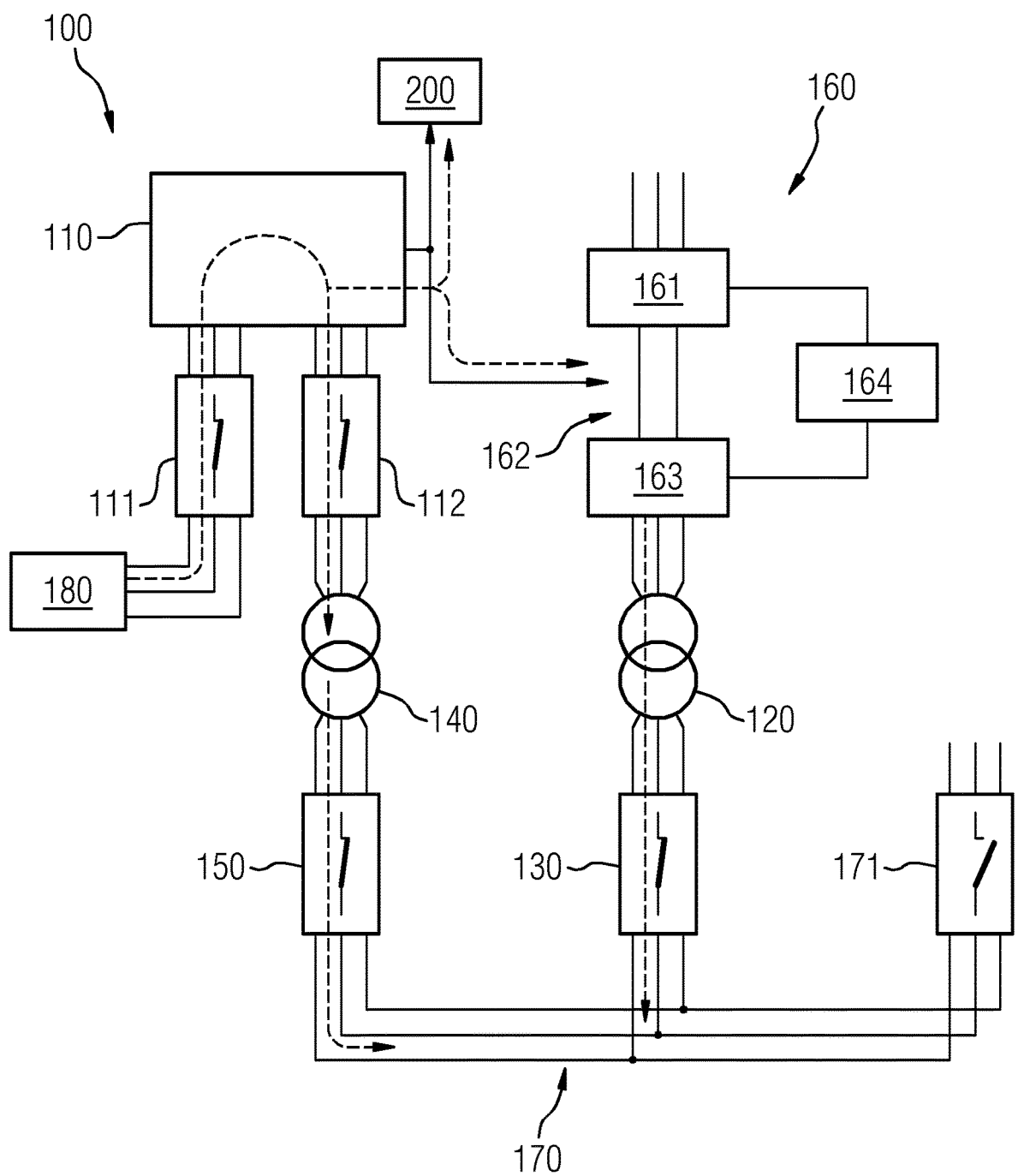
FIG. 3 shows an embodiment of an electrical power system for a wind turbine with illustrated energizing flow of components of the electrical power system while performing the method according to exemplary embodiment.

First, the low voltage circuit breaker 111 is closed and the power supply unit 180 is connected to the low voltage distribution system 110. Power supply unit 180 is thereby powering the low voltage distribution system 110. This flow of energizing the low voltage distribution system 110 from the power supply 180 is illustrated in FIG. 3.

In the following, the low voltage circuit breaker 112 is closed such that electrical connection is provided between the low voltage distribution system 110 and the auxiliary transformer 140. In this way, the power supply unit 180 is supplying the auxiliary transformer 140 with electrical power. This flow of energizing the auxiliary transformer 140 with electrical power from the power supply 180 is illustrated in FIG. 3. In an exemplary embodiment, the power supply unit 180 is a 3 phase, 400 volts, alternating current power supply unit. The auxiliary transformer 140 raises the voltage from the voltage level of the power supply unit 180 to a high voltage level to that high voltage level that would be used on the electrical grid 170 in the normal mode of operation of the electrical power system 100. In an exemplary embodiment, high voltage level on the auxiliary transformer 140 is 20 kilovolts. In general, a high voltage provided by the auxiliary transformer 140 in accordance with embodiments of the invention may be in a range of 5 kilovolts to 40 kilovolts in the range 10 kilovolts to 30 kilovolts.

The auxiliary transformer switchgear unit 150 is closed and the high voltage is provided to the electrical grid 170.

Actuation of all mentioned switchgear units and circuit breakers may be executed by means of Programmable Logic Controller (PLC) or Digital Signal Processor (DSP) or any suitable signal processing unit.

The electrical grid 170 may also be referred to as internal high voltage grid or switchgear bus. The electrical grid 170 may be connected to and/or disconnected from the external electrical grid by actuating grid connection switchgear 171.

As a further step, the power converter 160 is charged by means of the power supply unit 180. Electrical energy is provided, via the low voltage distribution system 110 to the direct current link 162 of the power converter 160. This flow of energizing the direct current link 162 of the power converter 160 from the power supply 180 is illustrated in FIG. 3.

The direct current link 162 of the power converter 160 may comprise a capacitor and/or an inductor capable for storing and releasing electrical energy (not shown in the figure). For transforming alternative current from the power supply unit 180 to direct current required for charging of the direct current link 162 of the power converter 160, the direct current pre-charging unit 165 may be used.

The direct current pre-charging unit 165 may comprise at least one rectifier and/or inverter.

Output of the power converter 160 is synchronised with the electrical grid 170. Converter control unit 164 controls the grid side converter 163 so that the phase and frequency of the grid side converter 163 output voltage match—are synchronous to—the phase and frequency of the electrical grid 170 voltage.

Once the power converter 160 output voltage is synchronised to the voltage of the electrical grid 170, main transformer switchgear unit 130 is closed, and electrical coupling is provided between the main transformer 120 and the electrical grid 170. This energization flow is illustrated in FIG. 3.

In this way all components of the electrical power system 100 will be provided—loaded—with their rated voltage. Once the components are loaded with their rated voltage, it is possible to perform inspection of the various electrical components of the electrical power system 100. Inspection may comprise visual and/or audial inspection of various switchgear units, cables and terminals. Visual inspection of terminals may include inspection of low voltage and high voltage terminals of transformers 140, 120 or terminals of power converter 160. Testing procedure may be considered successful if there is no trip in any of the switchgear components or if no other damage is visually visible, for example electric arcing or presence of fire and/or smoke. Additionally, for audial inspection, noise emitted by the components may be indicative of damage. Alternatively, inspection may comprise performing electrical test procedures, for example voltage and/or current measurements on the components of the electrical power system 100 on the transformers 120, 140 or the electrical power converter 160. Measurements are performed in defined time intervals 5 minute to 10 minute intervals. Measured voltage and/or current values are compared with predefined limit values. For example, measured voltage in high voltage side of the electrical power system 100 may be in the range of 18 kilovolts to 22 kilovolts in the range from 19 kilovolts to 21 kilovolts. Voltage measured in the low voltage side of the electrical power system 100, for example in the power supply unit 180, should correspond to the measured voltage in high voltage side, scaled down with the transformer ratio of the auxiliary transformer 140. Additionally, current provided from the power supply unit 180 to the auxiliary transformer 140 can be measured, during the test duration, and the measured current value can be compared against predefined threshold. For example, inspection may be considered successful if the measured current value, during the test duration, stays below 20 amperes or below 10 amperes. A skilled person, based on his experience, would select any—at least one—of the above disclosed testing methods to perform the testing procedure of the electrical power system 100.

High voltage required for energizing of the components connected to the electrical grid 170 is provided by means of the power supply unit 180. This method is advantageous compared to alternative ways of energizing high voltage components of the electrical power system 100 as no further external hardware is needed. Alternative ways of providing high voltage to the electrical grid 170 may include connecting the electrical grid 170 to external hardware equipment capable of providing matching high voltage to the electrical grid 170 of the electrical power system 100. Alternatively, assembled wind turbine comprising electrical power system 100 may be transported to a location where high voltage connection point is provided. Both alternative methods are particularly difficult to implement if the wind turbine comprising the electrical power system 100 is located offshore or in other locations distant from testing laboratories, for example at the final site or at an area of assembly, both onshore or offshore.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for performing a testing procedure of an electrical power system for a wind turbine by means of a power supply unit, wherein the method comprises:
    connecting the power supply unit to a low voltage distribution system of the wind turbine,
    closing a low voltage circuit breaker so that electrical connection is provided between the low voltage distribution system and an auxiliary transformer, such that the power supply unit supplies the auxiliary transformer with electrical power,
    providing electrical power to a power converter from the power supply unit via the low voltage distribution system thereby energizing a direct current link of the power converter,
    synchronizing the power converter with an electrical grid, and
    closing a main transformer switchgear unit such that electrical connection is provided between a main transformer and the electrical grid.

2. The method according to claim 1, wherein the power supply unit is a 3-phase alternating current low voltage power supply.

3. The method according to claim 1, wherein the power converter is switched off before connecting the power supply unit to the low voltage distribution system of the wind turbine.

4. The method according to claim 1, wherein the power converter includes at least two power converter units operating in parallel.

5. The method according to claim 1, wherein energizing the direct current link of the power converter is performed by providing direct current to the direct current link of the power converter via a direct current pre-charging unit.

6. The method according to claim 5, wherein the direct current pre-charging unit is adapted to convert alternating current from the low voltage distribution system to direct current for providing energy to the direct current link of the power converter.

7. The method according to claim 1, wherein the synchronization of the power converter and the electrical grid is achieved by a converter control unit controlling a grid side converter so that phase and frequency of the grid side converter output voltage match the phase and frequency of an electrical grid voltage.

8. The method according to claim 1, wherein the main transformer is a three-winding transformer with two windings connected to outputs of two power converter modules.

9. The method according to claim 1, wherein the electrical grid is an internal high voltage grid of the wind turbine.

10. An electrical power system, comprising:
    a low voltage distribution system,
    a power supply unit,
    a main transformer,
    a main transformer switchgear unit,
    an auxiliary transformer,
    an auxiliary transformer switchgear unit,
    a power converter, and
    an electrical grid,
    wherein the electrical power system is configured for
    connecting the power supply unit to the low voltage distribution system,
    closing a low voltage circuit breaker so that electrical connection is provided between the low voltage distribution system and the auxiliary transformer, such that the power supply unit supplies the auxiliary transformer with electrical power,
    providing electrical power to the power converter from the power supply unit via the low voltage distribution system thereby energizing a direct current link of the power converter,
    synchronizing the power converter with the electrical grid, and
    closing the main transformer switchgear unit such that electrical connection is provided between the main transformer and the electrical grid.

11. The electrical power system according to claim 10, wherein the electrical power system further comprises a distribution panel, a cooling system, a fire protection system, a direct current pre-charging unit, a control device, and electrical cables.

12. The electrical power system according to claim 11, wherein the direct current pre-charging unit is electrically connected with the low voltage distribution system of the wind turbine.

13. The electrical power system according to claim 11, wherein the direct current pre-charging unit is adapted to convert alternating current from the low voltage distribution system to direct current for providing energy to a direct current link of the power converter.

14. The electrical power system according to claim 10, wherein the power supply unit is integrated in a test bed or a workshop.

* * * * *